(12) United States Patent
Ma et al.

(10) Patent No.: US 6,506,673 B2
(45) Date of Patent: Jan. 14, 2003

(54) METHOD OF FORMING A REVERSE GATE STRUCTURE WITH A SPIN ON GLASS PROCESS

(75) Inventors: Yi Ma, Orlando, FL (US); Huili Shao, Allentown, PA (US); Joseph A. Taylor, Orlando, FL (US); Allen Yen, Allentown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/878,690

(22) Filed: Jun. 11, 2001

(65) Prior Publication Data

US 2002/0185739 A1 Dec. 12, 2002

(51) Int. Cl.[7] .......................................... H01L 21/4763
(52) U.S. Cl. ........................ 438/622; 438/99; 438/183; 438/623; 438/692
(58) Field of Search ................................ 438/183, 623, 438/692, 99, 287, 585; 257/634

(56) References Cited

U.S. PATENT DOCUMENTS

| | | | | |
|---|---|---|---|---|
| 5,157,002 A | * | 10/1992 | Moon | 438/183 |
| 6,071,807 A | * | 6/2000 | Watanabe et al. | 438/623 |
| 6,153,525 A | * | 11/2000 | Hendricks et al. | 438/692 |
| 6,284,562 B1 | * | 9/2001 | Batlogg et al. | 438/99 |
| 6,288,438 B1 | * | 9/2001 | Mizuhara et al. | 257/634 |
| 6,300,203 B1 | * | 10/2001 | Buynoski et al. | 438/287 |
| 6,306,741 B1 | * | 10/2001 | Lee et al. | 438/585 |

* cited by examiner

*Primary Examiner*—David Nelms
*Assistant Examiner*—Mai-Huong Tran

(57) ABSTRACT

The present invention provides a method that includes defining a dummy gate structure comprising a spin on glass on a semiconductor substrate, forming a dielectric layer over the dummy gate structure, removing the dummy gate structure to form a gate opening within the dielectric layer, and forming a gate material comprising a metal within the gate opening.

18 Claims, 4 Drawing Sheets

METHOD OF FORMING A REVERSE GATE STRUCTURE WITH A SPIN ON GLASS PROCESS

TECHNICAL FIELD OF THE INVENTION

The present invention is directed, in general, to a method of forming a reverse gate structure and, more specifically, to a method of forming a reverse gate structure with a spin on glass process.

BACKGROUND OF THE INVENTION

Smaller device size and higher speed of operation are both highly desirable performance targets for semiconductor devices. The overall size of semiconductor devices, such as transistors, have continually reduced in size as fabrication processes for producing various submicron devices have improved. With this overall size reduction, the size of the gate structures have also substantially decreased.

Polysilicon is one material used to form conventional gate electrode structures. However, the use of polysilicon gates, particularly in smaller Complementary Metal-Oxide-Silicon (CMOS) devices, causes several problems. One such problem is known as the polysilicon depletion effect, which affects drive current and device switching speed. This polysilicon depletion effect could be substantially reduced if the polysilicon gate electrode could be infinitely doped. Unfortunately, however, this is not possible. To circumvent this particular problem, the semiconductor manufacturing industry developed processes for manufacturing gate structures comprised of metal, which practically have an infinite (e.g., $5E22/cm^3$) amount of carriers as compared to conventional polysilicon gates.

One known process used to construct metal gates is a process that includes forming the metal gate in reverse order. In such an instance, a "dummy" gate is formed and later replaced with a metal gate. This is desired because the gate dielectric and gate electrodes are created after formation and activation of the source and drain regions. Because of this, high temperatures used to achieve the activation step do not have an opportunity to damage the metal gate.

Conventional reverse-gate processes employ a polysilicon dummy gate, as the dummy gate mentioned above. There are several disadvantages, however, associated with the use of the polysilicon dummy gate. For example, the fluoride etch required to define the polysilicon dummy gate negatively affects any silicon and oxide structures located thereby. This is partially because the fluoride etch chemistry is not sufficiently selective to the polysilicon dummy gate, and attacks the silicon and oxide structures located thereby.

Additionally, when the polysilicon dummy gate is removed, a residual polysilicon stringer is left behind, because polysilicon is irregular in shape. Complete removal of the dummy gate is critical because any residual polysilicon stringers affects the gate length and device performance. In an effort to remove any residual polysilicon and achieve smooth topography, the polysilicon is often over-etched, resulting in damage to the silicon surface in the channel area, and eventually, degradation in the transistor.

Another disadvantage associated with using the polysilicon dummy gate is that the conformal polysilicon film around the isolation structure makes the gate print more difficult.

Accordingly, what is needed in the art is a method of forming a reverse gate structure that address the problems discussed above.

SUMMARY OF THE INVENTION

To address the above-discuss ed deficiencies of the prior art, the present invention provides a method of manufacturing a transistor gate structure. In one embodiment, the method includes defining a dummy gate structure comprising a spin on glass on a semiconductor substrate, forming a dielectric layer over the dummy gate structure, removing the dummy gate structure to form a gate opening within the dielectric layer, and forming a gate material comprising a metal within the gate opening.

The foregoing has outlined advantageous and alternative exemplary features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying figures. It is emphasized that various features may not be drawn to scale. In fact, the dimensions of the various features may be arbitrarily increased or reduced for clarity of discussion.

DETAILED DESCRIPTION

Figure 1:
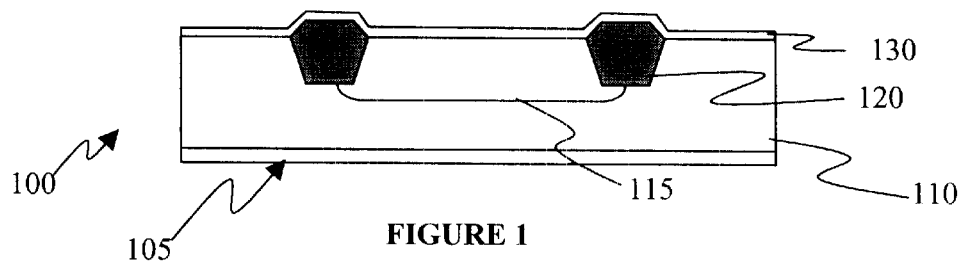
FIG. 1 illustrates a cross;-sectional view of an intermediate structure, wherein a sacrificial oxide layer has been deposited thereon.

Referring initially to FIG. 1, illustrated is an exemplary embodiment of an intermediate structure 100 from which a transistor gate structure in accordance with the principles of the present invention, may be formed. The intermediate structure 100 includes a semiconductor wafer 105 having a substrate layer 110, such as an epitaxial layer, deposited thereon, and on which the transistor gate structure according to the present invention will ultimately be formed. In the illustrated embodiment, the intermediate structure 100 includes an n-channel metal oxide semiconductor (NMOS) or a p-channel metal oxide semiconductor (PMOS) tub 115, an isolation structure 120, such as a trench isolation structure, and a sacrificial oxide layer 130, all of which may be formed with conventional processes and materials.

Figure 2:
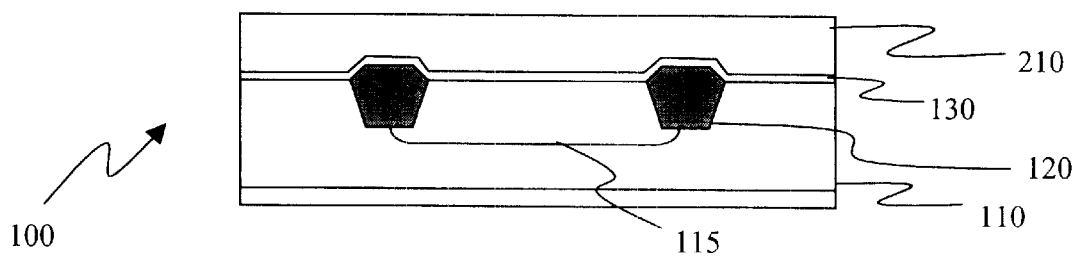
FIG. 2 illustrates a cross-sectional view of the intermediate structure after a layer of spin on glass has been deposited.

FIG. 2 illustrates a cross-sectional view of the intermediate structure 100 illustrated in FIG. 1, after a layer of spin on glass 210 has been formed thereover. The spin on glass layer 210 may comprise any organic material that is thermally stable and mechanically strong. Examples of spin on glass materials that may be used, include hydrogen silsesquioxane (HSQ) or organic polymers, such as polyarylenes or polyarylene-ethers, which include SiLK™, FLARE™ (AlliedSignal-Morristown, N.J.), and BCB™ (Dow Chemical, Midland, Mich.) Other spin on glass materials having appropriate spin on glass characteristics may also be used to form the spin on glass layer 210 and are within the scope of the present invention. Because the spin on glass layer 210 is deposited using a conventional spin on technique, it is not always necessary to planarize the surface of the spin on glass layer 210 as in conventional reverse-gate processes.

Figure 3:
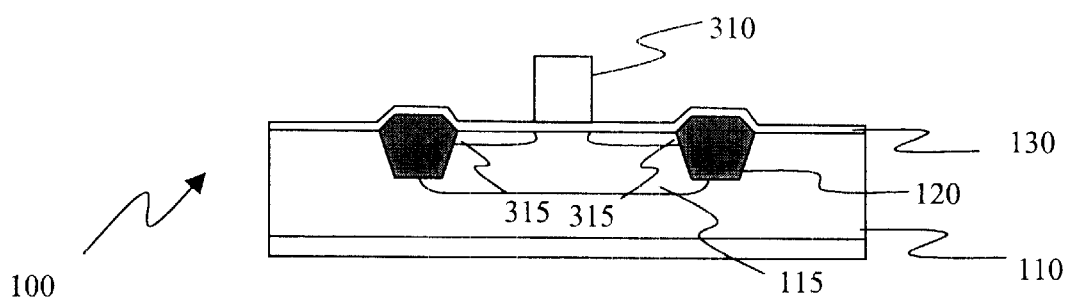
FIG. 3 illustrates a cross-sectional view of the intermediate structure after photoresist has been deposited and patterned, resulting in a dummy gate of spin on glass.

FIG. 3 illustrates a cross-sectional view of the intermediate structure 100 illustrated in FIG. 2, after patterning the spin on glass layer 210 with conventional photoresist and photolithographic techniques. This results in a dummy gate 310. If the layer of spin on glass layer 210 comprises SiLK, for instance, the dummy gate 310 may be defined from the spin on glass layer 210 using an oxygen/nitrogen/hydrogen plasma mixture to etch the unwanted material. In such embodiments, the oxygen may be flowed at about 300 sccm, the nitrogen may be flowed at about 100 sccm and the hydrogen may be flowed at about 100 sccm. The pressure may range from about 10 millitorr to about 40 millitorr, and the plasma power may be set at about 900 watts with a bias set at about 100 watts.

Unlike the present invention, conventional fluoride etch chemistry is not sufficiently selective to the polysilicon. Rather such etch chemistry will attack both the sacrificial oxide layer 130 and the substrate layer 110. In contrast, the etch chemistry of the present invention, which is used to form the dummy gate structure of spin on glass 310, is advantageously highly selective to the spin on glass layer 210. Thus, the etching process used to define the dummy gate structure from the spin on glass layer 210 is much more effective than conventional processes due to the etching chemistry's higher selectivity for spin on glass materials.

After formation of the dummy gate 310, conventional source/drain regions 315 may be formed. One skilled in the art understands how to form the source/drain regions 315, including subjecting the intermediate structure 100 to either a P-type or an N-type dopant. Because source/drain formation is such a conventional process, further discussion is not warranted. However, it should be noted that the activation anneal will be performed after the removal of the dummy gate 310.

Figure 4:
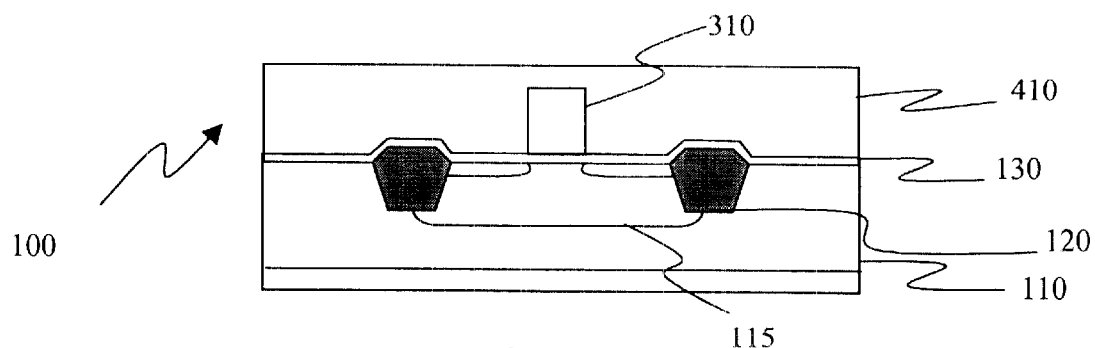
FIG. 4 illustrates a cross-sectional view of the intermediate structure after a dielectric layer has been deposited over the dummy gate of spin on glass.

FIG. 4 illustrates the intermediate structure 100 shown in FIG. 3 after a conventional deposition of a dielectric layer 410 over the dummy gate 310. In an advantageous embodiment, the dielectric layer 410 is a layer of silicon dioxide.

Figure 5:
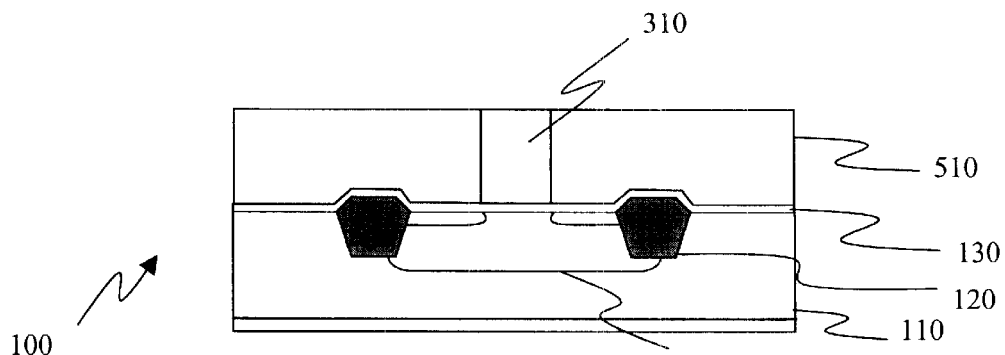
FIG. 5 illustrates a cross-sectional view of the intermediate structure after the dielectric layer is etched back to expose the dummy gate of spin on glass.

FIG. 5 illustrates the intermediate structure 100 shown in FIG. 4 after the dielectric layer 410 is conventionally planarized back to expose the dummy gate 310. One skilled in the art understands how to planarize the dielectric layer 410, including using a conventional chemical mechanical planarization (CMP) process or topography reduction etching process.

Figure 6:
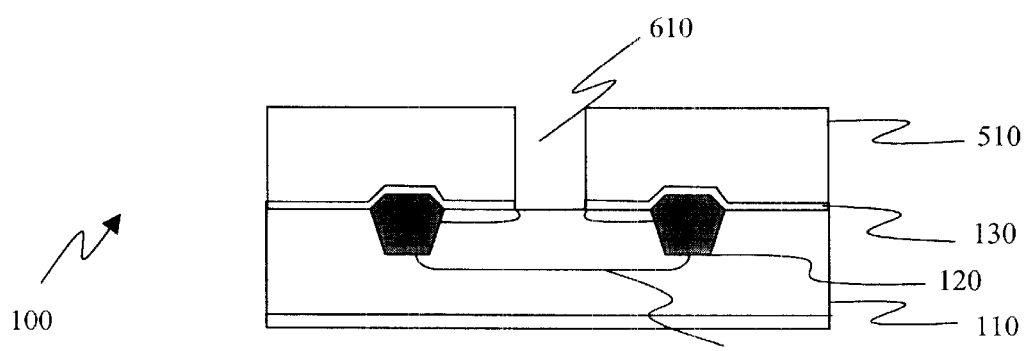
FIG. 6 illustrates a cross-sectional view of the intermediate structure after the dummy gate of spin on glass and the sacrificial oxide layer are removed.

FIG. 6 illustrates the intermediate structure shown in FIG. 5 after the dummy gate 310 and the underlying sacrificial oxide layer 130 are conventionally removed. This removal process, in an exemplary embodiment, may be accomplished using an oxygen plasma. In such an embodiment, the oxygen plasma mixture may include oxygen and nitrogen in which the oxygen is flowed at about 3750 sccm and the nitrogen is flowed at about 375 sccm. Additionally, the temperature is preferably about 250° C., the pressure is about 2 torr, and the plasma power may be about 1400 watts.

Because of the chemical properties of the spin on glass materials discussed above, the dummy gate removal process is much smoother than the removal of polysilicon dummy gates in conventional reverse-metal processes. Polysilicon dummy gates of conventional reverse-metal processes have an irregular shape, so when the dummy gate is removed, residual polysilicon stringers are left behind. Thus, the spin on glass makes a much finer surface, which in turn, accommodates a smaller depth of focus. This, advantageously, enables printing of narrower line width gate structures.

Figure 7:
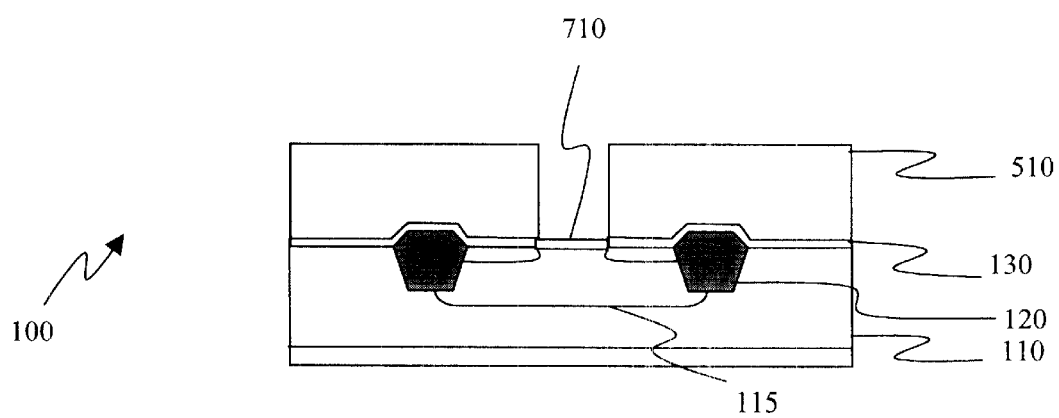
FIG. 7 illustrates a cross-sectional view of the intermediate structure after a gate dielectric layer is deposited.

FIG. 7 illustrates the intermediate structure 100 shown in FIG. 6 after a gate dielectric layer 710 is conventionally formed within the opening 610. In an exemplary embodiment, the gate dielectric layer 710 is formed to a predetermined and desired thickness. The material used to construct the dielectric layer 710 may vary. For example, the material may be silicon dioxide, tantalum pentoxide, silicon nitride or an aluminum oxide. As illustrated, the gate dielectric layer 710 is located over the tub 115.

Figure 8:
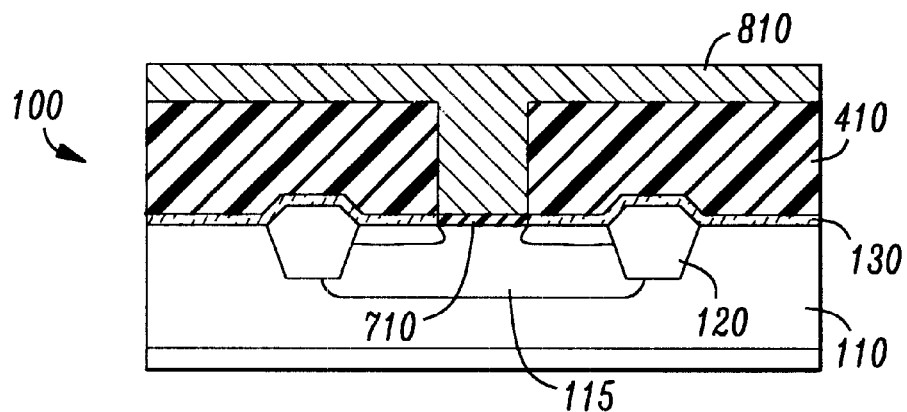
FIG. 8 illustrates a cross-sectional view of the intermediate structure after a metal gate layer is deposited.

FIG. 8 illustrates the intermediate structure 100 shown in FIG. 7 after a metal layer 810 is conventionally deposited over the gate dielectric layer 710 or metal etch barrier layer. Some examples of conductive material used as the metal layer 810, include: tantalum, tungsten, tungsten silicide, tantalum nitride, or titanium. While many conductive materials have been listed, an exemplary embodiment has the metal layer 810 comprising conventionally deposited titanium nitride. Please take note, however, that the above list is not all-inclusive, and that other materials are within the scope of the present invention.

Figure 9:
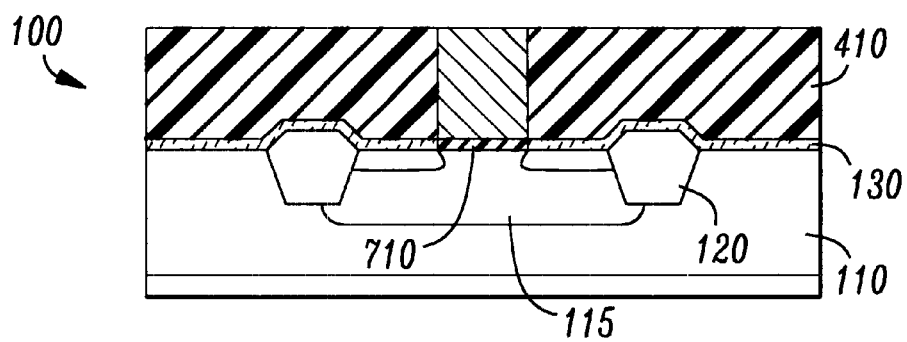
FIG. 9 illustrates a cross-sectional view of the intermediate structure after the metal gate layer is etched back to the dielectric layer.

FIG. 9 illustrates the intermediate structure shown in FIG. 8 after the metal layer 810 is conventionally planarized back to the dielectric layer 410. Similar to above, the metal layer 810 may be planarized using a conventional CMP or other similar process.

Figure 10:
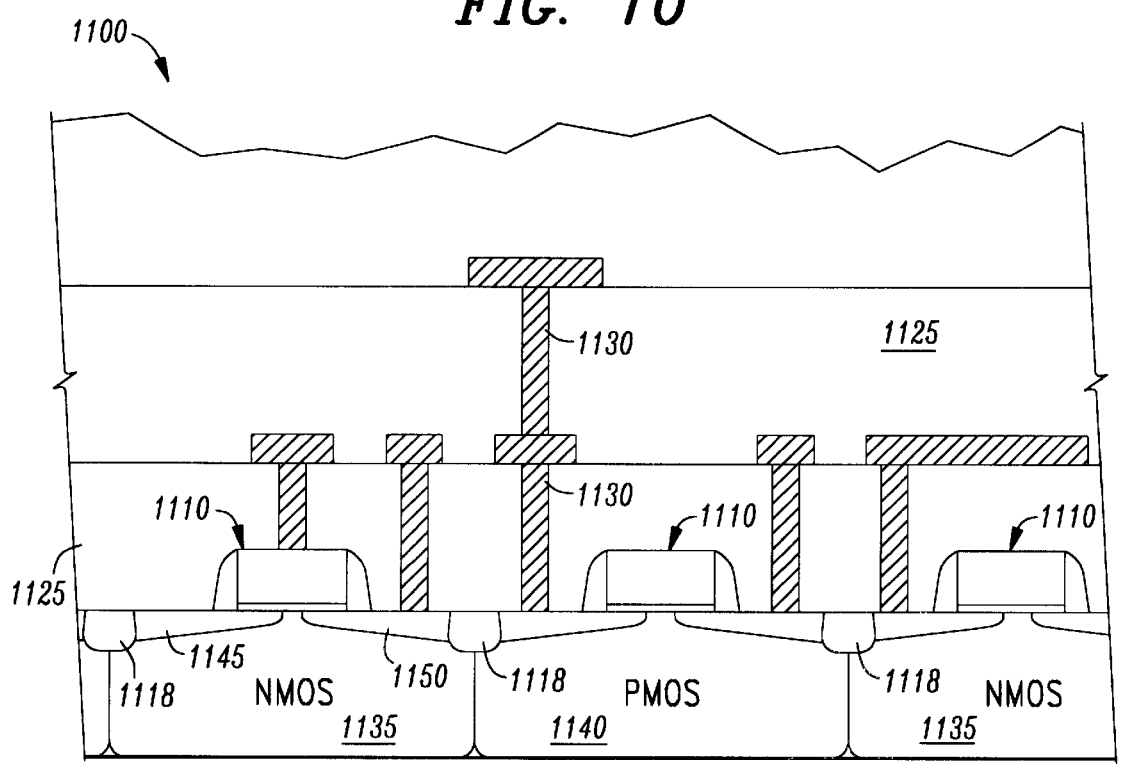
FIG. 10 illustrates a cross-sectional view of an integrated circuit, which provides one environment where a transistor gate structure, may be used.

FIG. 10 illustrates a cross-sectional view of an integrated circuit 1100, which may provide one environment where a completed transistor gate structure 1110 constructed in accordance with the principles of the present invention, may be used. The integrated circuit 1100 may further include CMOS devices, BICMOS devices, field effect transistors, generally, or another device commonly incorporated into integrated circuit designs. Also shown in FIG. 11 are additional components of the integrated circuit 1100, including: the transistor gate structures 1110 located between conventionally formed isolation structures 1118, conventionally formed interlevel dielectric layers 1125 and interconnect structures 1130. The interconnect structures 1130 connect the transistor gate structures 1110 to other areas of the integrated circuit 1100. Also included in the integrated circuit 1100 are conventional NMOS tubs, 1135 and PMOS tubs 1140, source regions 1145 and drain regions 1150 for each of the transistor gate structures 1110.

Although the present invention has been described in detail, those skilled in the art should understand that they can make various changes, substitutions and alterations herein without departing from the spirit and scope of the invention in its broadest form.

What is claimed is:

1. A method of manufacturing an integrated circuit, comprising:

defining a dummy gate structure comprising a spin on glass material on a semiconductor substrate;

forming a dielectric layer over the dummy gate structure;

removing the dummy gate structure to form a gate opening within the dielectric layer; and forming a gate material comprising a metal within the gate opening.

2. The method as recited in claim 1 wherein defining the dummy gate structure includes etching the spin on glass material with a oxygen/nitrogen/hydrogen etching chemistry.

3. The method as recited in claim 1 wherein the spin on glass material is an organic polymer or a fluorinated oxide.

4. The method as recited in claim 3 wherein the organic polymer comprises polyarylene or polyarylene-ethers.

5. The method as recited in claim 1 further including forming isolation structures in the semiconductor substrate and forming a sacrificial oxide layer over the isolation structures and the semiconductor substrate prior to defining the dummy gate structure.

6. The method as recited in claim 1 wherein forming a dielectric layer over the dummy gate structure includes forming a silicon dioxide layer over the dummy gate structure.

7. The method as recited :in claim 1 wherein removing the dummy gate structure includes removing the dummy gate structure using an oxygen plasma.

8. The method as recited in claim 1 wherein forming a gate material includes forming a metal within the opening wherein the metal is copper, tungsten, titanium, tantalum, titanium nitride, or tantalum nitride.

9. A method of manufacturing an integrated circuit, comprising:

defining dummy gate structures comprising a spin on glass material on a semiconductor substrate;

forming a dielectric layer over the dummy gate structures;

removing the dummy gate structures to form gate openings within the dielectric layer; and forming a transistor gate conductor within each of the gate openings.

10. The method as recited in claim 9 wherein defining the dummy gate structure includes etching the spin on glass material with an oxygen/nitrogen/hydrogen etch chemistry.

11. The method as recited in claim 9 wherein the spin on glass material is an organic polymer or a fluorinated oxide.

12. The method as recited in claim 11 wherein the organic polymer is polyarylene or polyarylene-ethers.

13. The method as recited in claim 9 further including forming isolation structures in the semiconductor substrate and forming a sacrificial oxide layer over the isolation structures and the semiconductor substrate prior to defining the dummy gate structures.

14. The method as recited in claim 9 wherein forming a dielectric layer over the dummy gate structures includes forming a silicon dioxide layer over the dummy gate structures.

15. The method as recited in claim 9 wherein removing the dummy gate structures includes removing the dummy gate structure using an oxygen plasma.

16. The method as recited in claim 9 wherein forming a transistor gate conductor includes forming a metal within each of the openings wherein the metal is copper, tungsten, titanium, tantalum, titanium nitride, or tantalum nitride.

17. The method as recited in claim 9 wherein forming a transistor gate conductor includes forming transistor gates comprising metal.

18. The method as recited in claim 17 further including forming tubs and source/drain regions in the semiconductor substrate for each of the transistors and forming an interconnect structure within dielectric layers located over the transistors to interconnect the transistors and form an operative integrated circuit.

\* \* \* \* \*